(12) United States Patent
Annampedu et al.

(10) Patent No.: US 7,768,437 B2
(45) Date of Patent: Aug. 3, 2010

(54) SYSTEMS AND METHODS FOR REDUCING THE EFFECTS OF ADC MISMATCH

(75) Inventors: Viswanath Annampedu, Schnecksville, PA (US); Venkatram Muddhasani, Bethlehem, PA (US)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 12/111,294

(22) Filed: Apr. 29, 2008

(65) Prior Publication Data

US 2009/0267819 A1    Oct. 29, 2009

(51) Int. Cl.
    H03M 1/36      (2006.01)
(52) U.S. Cl. ...................... 341/159; 341/155
(58) Field of Classification Search .............. 341/155, 341/159, 122, 120
    See application file for complete search history.

(56) References Cited

U.S. PATENT DOCUMENTS

| | | | |
|---|---|---|---|
| 3,973,182 A | 8/1976 | Kataoka | |
| 3,973,183 A | 8/1976 | Kataoka | |
| 4,024,571 A | 5/1977 | Dischert et al. | |
| 4,777,544 A | 10/1988 | Brown et al. | |
| 5,130,866 A | 7/1992 | Klaassen et al. | |
| 5,237,325 A * | 8/1993 | Klein et al. | 341/155 |
| 5,278,703 A | 1/1994 | Rub et al. | |
| 5,309,357 A * | 5/1994 | Stark et al. | 250/363.02 |
| 5,341,249 A | 8/1994 | Abbott et al. | |
| 5,521,948 A | 5/1996 | Takeuchi | |
| 5,523,902 A | 6/1996 | Pederson | |
| 5,696,639 A | 12/1997 | Spurbeck et al. | |
| 5,781,129 A * | 7/1998 | Schwartz et al. | 341/51 |
| 5,798,885 A | 8/1998 | Saiki et al. | |
| 5,835,295 A | 11/1998 | Behrens | |
| 5,844,920 A | 12/1998 | Zook et al. | |
| 5,852,524 A | 12/1998 | Glover et al. | |
| 5,986,830 A | 11/1999 | Hein | |
| 5,987,562 A | 11/1999 | Glover | |
| 6,009,549 A | 12/1999 | Bliss et al. | |

(Continued)

OTHER PUBLICATIONS

Annampedu, V. and Aziz, P.M., "Adaptive Algorithms for Asynchronous Detection of Coded Servo Signals Based on Interpolation", IEEE Trans. on Mag., vol. 41, No. 10, Oct. 2005.

(Continued)

*Primary Examiner*—Peguy JeanPierre
(74) *Attorney, Agent, or Firm*—Hamilton, DeSanctis & Cha

(57) ABSTRACT

Various embodiments of the present invention provide systems and methods for utilizing a plurality of potentially mismatched analog to digital converters. For example, a method for adaptively processing a variety of input signals is disclosed. The method includes providing an adaptive loop circuit, and a first and second circuit pairs. The first circuit pair includes a first analog to digital converter and first register, and the second circuit pair includes a second analog to digital converter and a second register. An input signal is received and an event status is received. The event status initially indicates that the input signal includes data associated with a first event and subsequently indicates that the input signal includes data associated with a second event. The first circuit pair to drive the adaptive loop circuit when the first event is indicated, and the second circuit pair to drive the adaptive circuit when the second event is indicated.

19 Claims, 4 Drawing Sheets

U.S. PATENT DOCUMENTS

| | | | |
|---|---|---|---|
| 6,023,383 A | 2/2000 | Glover et al. | |
| 6,069,583 A * | 5/2000 | Silvestrin et al. | 342/357.01 |
| 6,081,397 A | 6/2000 | Belser | |
| 6,111,712 A | 8/2000 | Vishakhadatta et al. | |
| 6,195,031 B1 * | 2/2001 | Feld et al. | 341/159 |
| 6,208,478 B1 | 3/2001 | Chiu et al. | |
| 6,278,591 B1 | 8/2001 | Chang et al. | |
| 6,441,661 B1 | 8/2002 | Aoki et al. | |
| 6,490,110 B2 | 12/2002 | Reed et al. | |
| 6,493,162 B1 | 12/2002 | Fredrickson | |
| 6,519,102 B1 | 2/2003 | Smith | |
| 6,530,060 B1 | 3/2003 | Vis et al. | |
| 6,603,622 B1 | 8/2003 | Christiansen et al. | |
| 6,606,048 B1 * | 8/2003 | Sutardja | 341/155 |
| 6,646,822 B1 | 11/2003 | Tuttle et al. | |
| 6,657,802 B1 | 12/2003 | Ashley et al. | |
| 6,664,907 B1 * | 12/2003 | Knepper et al. | 341/120 |
| 6,788,484 B2 | 9/2004 | Honma | |
| 6,813,108 B2 | 11/2004 | Annampedu et al. | |
| 6,816,328 B2 | 11/2004 | Rae | |
| 6,839,014 B2 * | 1/2005 | Uda | 341/155 |
| 6,856,183 B2 | 2/2005 | Annampedu | |
| 6,876,511 B2 | 4/2005 | Koyanagi | |
| 6,912,099 B2 | 6/2005 | Annampedu et al. | |
| 6,963,521 B2 | 11/2005 | Hayashi | |
| 6,999,257 B2 | 2/2006 | Takeo | |
| 6,999,264 B2 | 2/2006 | Ehrlich | |
| 7,002,767 B2 | 2/2006 | Annampedu et al. | |
| 7,038,875 B2 | 5/2006 | Lou et al. | |
| 7,072,137 B2 | 7/2006 | Chiba | |
| 7,082,005 B2 | 7/2006 | Annampedu et al. | |
| 7,092,462 B2 | 8/2006 | Annampedu et al. | |
| 7,126,776 B1 | 10/2006 | Warren, Jr. et al. | |
| 7,136,250 B1 | 11/2006 | Wu et al. | |
| 7,167,328 B2 | 1/2007 | Annampedu et al. | |
| 7,176,816 B2 * | 2/2007 | Koerner et al. | 341/120 |
| 7,180,693 B2 | 2/2007 | Anaampedu et al. | |
| 7,187,739 B2 | 3/2007 | Ma | |
| 7,191,382 B2 | 3/2007 | James et al. | |
| 7,193,544 B1 * | 3/2007 | Fitelson et al. | 341/143 |
| 7,193,798 B2 | 3/2007 | Byrd et al. | |
| 7,199,961 B1 | 4/2007 | Wu et al. | |
| 7,206,146 B2 | 4/2007 | Flynn et al. | |
| 7,253,984 B1 | 8/2007 | Patapoutian et al. | |
| 7,362,536 B1 | 4/2008 | Liu et al. | |
| 7,411,531 B2 | 8/2008 | Aziz et al. | |
| 7,420,498 B2 * | 9/2008 | Barrenscheen | 341/155 |
| 7,423,827 B2 | 9/2008 | Neville et al. | |
| 7,446,690 B2 * | 11/2008 | Kao | 341/155 |
| 2002/0001151 A1 | 1/2002 | Lake | |
| 2002/0150179 A1 | 10/2002 | Leis et al. | |
| 2002/0176185 A1 | 11/2002 | Fayeulle et al. | |
| 2003/0095350 A1 | 5/2003 | Annampedu et al. | |
| 2005/0157415 A1 | 7/2005 | Chiang | |
| 2005/0243455 A1 | 11/2005 | Annampedu | |
| 2007/0071152 A1 | 3/2007 | Chen et al. | |
| 2007/0183073 A1 | 8/2007 | Sutardja et al. | |
| 2007/0230015 A1 | 10/2007 | Yamashita et al. | |
| 2008/0080082 A1 | 4/2008 | Erden et al. | |

OTHER PUBLICATIONS

Aziz and Annampedu, "Asynchronous Maximum Likelihood (ML) Detection of Servo repeatable Run Out (RRO) Data".

Aziz & Annampedu, "Interpolation Based Maximum-Likelihood(ML) Detection of Asynchronous Servo Repeatable Run Out (RRO) Data", IEEE Int. Mag. Con., vol. 42, No. 10, Oct. 2006.

* cited by examiner

SYSTEMS AND METHODS FOR REDUCING THE EFFECTS OF ADC MISMATCH

BACKGROUND OF THE INVENTION

The present inventions are related to systems and methods for alleviating analog to digital converter mismatches.

Analog to digital converters are a staple in mixed signal semiconductor designs as they allow for operation on signals in both the digital and analog domains. In some cases, a mixed signal semiconductor device may employ a large number of analog to digital converters allowing the implementation to accept and process a large number of inputs. When multiple analog to digital converters are utilized, such as in a read channel device, there may be some mismatch between one or more of the analog to digital converters. The mismatch is typically in the form of, among other things, different gains, different offsets, and/or different comparator threshold voltages. These mismatches pose a serious problem to adaptive digital loops that retain a preceding completion point in memory to be used as a succeeding initialization point. Thus, for example, this may be a problem where the completion point of a preceding sector is maintained as an initialization point for a succeeding sector in a read channel device as the previous sector may have relied on a different analog to digital converter than that utilized by the succeeding sector. Such a scenario may result in unacceptable servo burst demodulation problems and/or into undesirable timing and gain control effects.

To address the aforementioned limitations, some designs have utilized a single analog to digital converter tasked with performing a wide array of operations. Turning to FIG. 1, a prior art system 100 relying on a single, complex analog to digital converter 110 covering a spectrum of operations is shown. Analog to digital converter 110 receives an analog input 105 and provides a digital representation of analog input 105 to a gain loop 120. Gain loop 120 performs is particular function and provides a result to a shadow register 130. Shadow register 130 stores the output of gain loop 120 whenever indicated by the completion of one of a number of events as denoted by the output of an OR gate 140. Shrinking feature sizes in CMOS technologies pose severe limitations to system 100 where varied temperature, voltage and other factors can render the design of analog to digital comparator 110 complex and power inefficient. To avoid the limitations of system 100, some designs have used multiple analog to digital comparators that may be relatively simple designs, but that include inherent mismatches. In addition, a dedicated microprocessor is used to implement a sophisticated calibration scheme to alleviate the effects of the inherent mismatches. Usually, the calibration procedure is done before the device resumes normal operation. It should be noted that even after extensive calibration, all mismatches will not necessarily be eliminated and may continue to adversely effect operation.

Hence, for at least the aforementioned reasons, there exists a need in the art for advanced systems and methods for operating in relation to analog to digital converters.

BRIEF SUMMARY OF THE INVENTION

The present inventions are related to systems and methods for alleviating analog to digital converter mismatches.

Various embodiments of the present invention provide adaptive loops that are capable of adapting to at least two distinct signal sets. Such adaptive loops include a generalized circuit including a signal input, an initialization input, and an output. Further, the adaptive loops include a first analog to digital converter, a first register, a second analog to digital converter, and a second register. An input is provided to both the first analog to digital converter and the second analog to digital converter. A signal input selector selects the first analog to digital converter to drive the signal input based on a first event, and selects the second analog to digital converter to drive the signal input based on a second event. In some cases, the signal input selector further selects the first register to drive the initialization input based on the first event, and selects the second register to drive the initialization input based on a second event. In some cases, the signal input selector is further operable to determine a first conclusion point associated with the first event and a second conclusion point associated with the second event. In such cases, the signal input selector is further operable to cause the first register to store the output whenever the first conclusion point is indicated, and wherein the signal input selector is further operable to cause the second register to store the output whenever the second conclusion point is indicated. In some cases, the adaptive loop includes a first multiplexer operable to provide an output of the first analog to digital converter or an output of the second analog to digital converter to drive the signal input; and the adaptive loop includes a second multiplexer operable to provide an output of the first register or an output of the second register to drive the initialization input.

In some instances of the aforementioned embodiments, the generalized loop is a gain loop. In such cases, the adaptive loop may be implemented as part of a read channel device where the first event indicates a first sector of a storage medium and the second event indicates a second sector of the storage medium. In other cases, the first event may indicate a first region of a sector of a storage medium, and the second event may indicate a second region of the sector of the storage medium.

In one or more instances of the aforementioned embodiments, the adaptive loop further includes a calibration control circuit that is operable to associate the first analog to digital converter with the first event, and to associate the second analog to digital converter with the second event. In such instances, the calibration control circuit may be implemented in one of a variety of ways including, but not limited to, a general purpose processor executing computer executable instructions, or a dedicated hardware circuit.

Other embodiments of the present invention provide methods for adaptively processing a variety of input signals, the methods include providing an adaptive loop circuit, and a first and second circuit pairs. The first circuit pair includes a first analog to digital converter and first register, and the second circuit pair includes a second analog to digital converter and a second register. An input signal is received and an event status is received. The event status initially indicates that the input signal includes data associated with a first event and subsequently indicates that the input signal includes data associated with a second event. The first circuit pair to drive the adaptive loop circuit when the first event is indicated, and the second circuit pair to drive the adaptive circuit when the second event is indicated. In particular cases, the adaptive circuit is a gain loop.

In some instances of the aforementioned embodiments, the adaptive loop circuit includes a signal input, an initialization input, and an output. An output of the first register drives the initialization input and an output of the first analog to digital converter drives the signal input when the first event is indicated. An output of the second register drives the initialization input and an output of the second analog to digital converter drives the signal input when the second event is indicated. In some instances, the method further includes receiving an indication of a conclusion of the first event; and writing the output to the first register; and receiving an indication of a conclusion of the second event, and writing the output to the second register.

In various instances of the aforementioned embodiments, the methods further include performing a calibration process. In such instances, the calibration process includes associating the first analog to digital converter with the first event, and associating the second analog to digital converter with the second event.

Yet other embodiments of the present invention provide storage systems. Such storage systems include a storage medium and a read channel circuit. The read channel circuit includes an adaptive control circuit having a signal input, an initialization input and an output. The adaptive control circuit includes a first circuit pair and a second circuit pair. The first circuit pair includes a first analog to digital converter and first register, and the second circuit pair includes a second analog to digital converter and a second register. The adaptive control circuit further includes a signal input selector that selects the first analog to digital converter to drive the signal input and the first register to drive the initialization input based on a first event, and selects the second analog to digital converter to drive the signal input and the second register to drive the initialization input based on a second event. The storage system includes an input signal derived from the storage medium and provided as an input to both the first analog to digital converter and the second analog to digital converter.

This summary provides only a general outline of some embodiments of the invention. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present invention may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components or to a non-specific one of the referenced elements.

DETAILED DESCRIPTION OF THE INVENTION

The present inventions are related to systems and methods for alleviating analog to digital converter mismatches.

Various embodiments of the present invention utilize paired analog to digital converters and initialization registers. Such an approach recognizes the possibility of mismatches, but reduces the effect of mismatches by decoupling the initialization point from one event from the completion point of an unrelated event, while at the same time assuring that useful initialization information is maintained.

Figure 1:
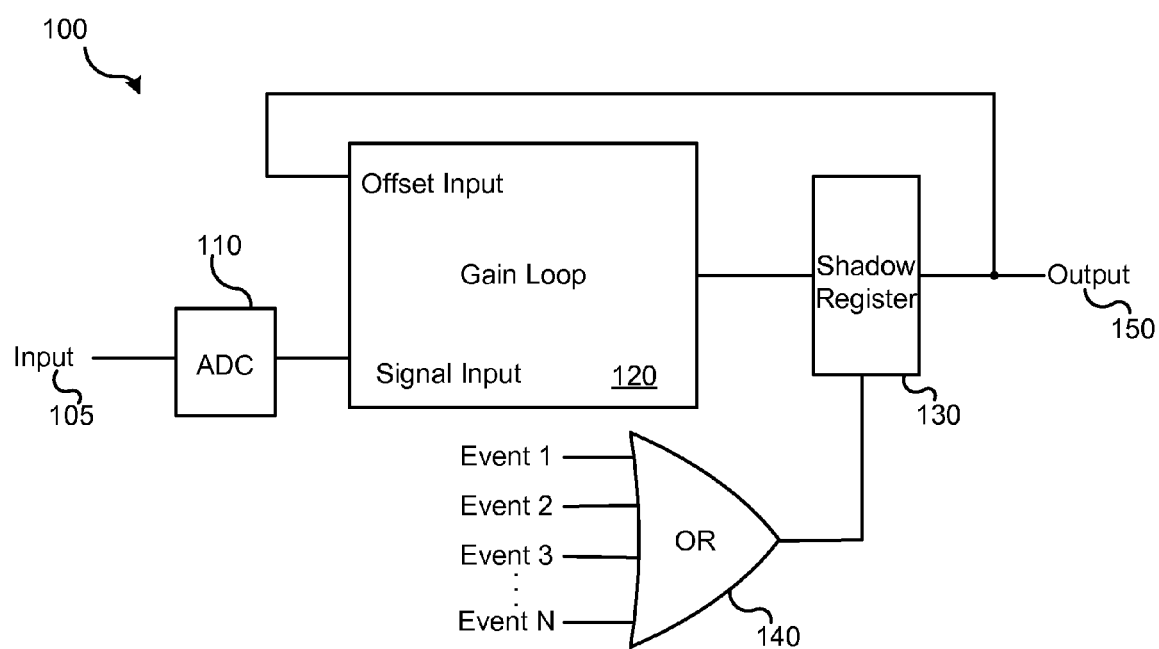
FIG. 1 depicts a prior art system relying on a single, complex analog to digital converter covering a spectrum of operations.
Figure 2:
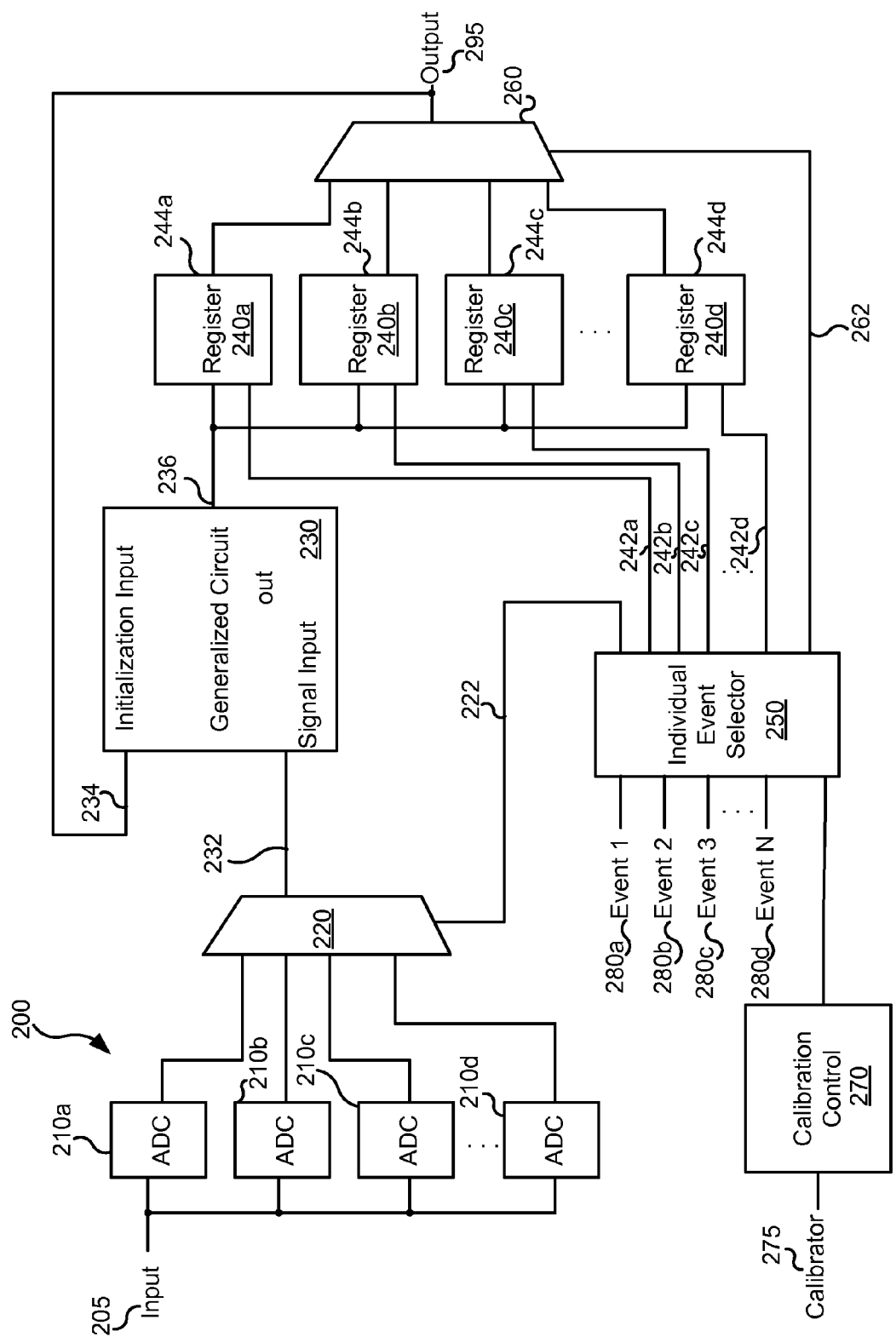
FIG. 2 depicts a system relying on multiple potentially mismatched analog to digital converters covering a spectrum of operations in accordance with some embodiments of the present invention.

Turning to FIG. 2, a system 200 relying on multiple potentially mismatched analog to digital converters 210 covering a spectrum of operations is depicted in accordance with some embodiments of the present invention. Each of analog to digital converters 210 receive an analog input 205 and provide a corresponding digital output to a multiplexer 220. The digital output from one of analog to digital converters 210 is selected using a select control 222 provided by an individual event selector circuit 250 to drive a generalized circuit 230. Generalized circuit 230 may be any circuit that may be reused in relation to different events and/or operations. Generalized circuit 230 includes a signal input 232, an initialization input 234 and an output 236. As one example, generalized circuit 230 may be, but is not limited to, a gain control loop as are known in the art. Such a gain control loop provides output 236 based on a signal input 232 and an initialization input 234. By implementing the circuit similar to that discussed in relation to FIG. 2, a generalized circuit may be used in relation to a number of operations or events thus saving power and/or semiconductor die space.

Output 236 of generalized circuit 230 is provided to a number of registers 240 that may be individually selected to hold the results of generalized circuit 230 for later use to drive initialization input 234 of generalized circuit 230. Each of registers 240 is controlled by a respective write line 242 driven by individual even selector input 250. A multiplexer 260 receives outputs 244 from registers 240 and selects between outputs 244 based on a select control 262 from individual even selector input 250 to drive initialization input 234.

Event selector circuit 250 receives a number of event status signals 280 that indicate which of a number of events is ongoing. For example, in a read channel scenario, event status signals may be associated with data being received from respective sectors of a hard disk, or with different regions of a respective sector. Such regions may include, but are not limited to, a gray code region or a burst demodulation region as are known in the art. Based on the disclosure provided herein, one of ordinary skill in the art will recognize a variety of different events or operations that may be associated with respective event status signals 280 in accordance with different embodiments of the present invention. In response to event selector signals 280, individual event selector circuit 250 asserts select control 222 and select control 262 such that a respective analog to digital converter 210 and register 240 is selected. This provides a matched signal input 232 and initialization input 234 pair. Further, once the particular event is complete, individual event selector circuit 250 asserts a selected write line 242 causing the associated register 240 to store the result available at output 236. The stored value can be used as an initialization input the next time the corresponding analog to digital converter 210 and register 24 are selected by individual event selector circuit 250 based on event status signals 280.

In operation, predetermined signals may be applied at input 205 such that a calibration input 275 is generated. Calibration input 275 is provided to a calibration control circuit 270 which in turn selects an appropriate analog to digital converter 210 for use in relation to signals associated with different events or operations that are designated by event status signals 280. In some cases, calibration control circuit 270 is a dedicated circuit, while in other cases, it may be implemented as software executed on a general purpose microprocessor. This calibration is performed using calibration techniques known in the art and generally at startup. The calibration results are used by calibration control 270 to establish static pairs of analog to digital converters 210 and registers 240. This pairing may be maintained in a register set implemented as part of individual event selector circuit 250.

As previously mentioned, system 200 may be implemented as part of a read channel device in a magnetic storage medium. In such a scenario, input 205 may receive a serial stream of data derived from a magnetic storage medium. The data may be derived from different sectors on the magnetic storage medium, and from different regions within the aforementioned sectors. The different regions and/or sectors may be differentiated by the assertion of different event status inputs 280. When a particular event status input 280 is asserted, a corresponding pair of analog to digital converter 210 and register 240 may be selected for operation. Selected register 240 provides initialization input 234 to generalized circuit 230 (e.g., a gain loop), and selected analog to digital converter 210 provides signal input 232 to generalized circuit 230. At the end of the process implemented by generalized circuit 230, output 236 is stored to selected register 240 for later use as initialization input 234. This initialization input is used in subsequent processing when the event status input 280 corresponding to the selected register is again asserted.

When data input 205 transitions to a different sector and/or region within a sector, individual event selector circuit 250 selects a different analog to digital converter 210 and register 240 pair. The newly selected register 240 provides initialization input 234 to generalized circuit 230, and selected analog to digital converter 210 provides signal input 232 to generalized circuit 230. Thus, an initialization input 234 specific to the asserted event status signal is used, and not merely the last state of output 236 of generalized circuit 230. At the end of the process implemented by generalized circuit 230, output 236 is stored to the newly selected register 240 for later use as initialization input 234. Of note, it is not important that analog to digital converter 210 match as the output derived from one analog to digital converter 210 is not used as an initialization input 234 that is paired with signal input 232 derived from another analog to digital converter 210. Rather, a particular register 240 is paired with a particular analog to digital converter 210 such that a given initialization input 234 derived from the output of a given analog to digital converter 210 is paired with a subsequent signal input 232 derived from the same analog to digital converter 210.

As an example, using only a single register 240 to capture the output of generalized circuit 230 implemented as a gain loop, an output having a positive one dB gain error may be derived from analog to digital converter 210a. In subsequent processing, generalized processing circuit 230 will go in the negative direction to reduce the gain by one dB based on the previously recorded result even though signal input 232 is derived from a different generalized circuit 230. If, in the next sector processed by analog to digital converter 210b, analog to digital converter 210b exhibits a negative one dB error, generalized circuit 230 has to compensate for a negative two dB error where the previous output from generalized circuit 230 is used as an initialization input 234. Since more error is to be corrected, generalized circuit 230 may take longer to settle and correct the error. This may negatively effect operation. For example, the servo burst demodulation is severely affected by the gain loop behavior due to mismatched analog to digital converters. Timing recovery is another area where the problem is noticed. When the mismatch between ADCs is large, the digital timing loop may not track the timing errors and may eventually lose lock of the timing information. Digital gain control loop may also be adversely affected. In general, any adaptive loop which has memory i.e. whose starting value depends on previous event (which uses a different analog to digital converter) will be stressed and affected.

In contrast, embodiments of the present invention use output 236 generated from data derived from a particular analog to digital converter 210. Thus, using the same example as that discussed above, an output having a positive one dB gain error may be derived from analog to digital converter 210a. This error is stored in a register 240 associated with analog to digital converter 210a. In subsequent processing of data derived from analog to digital converter 210a, generalized processing circuit 230 will go in the negative direction to reduce the gain by one dB based on the previously recorded result. In the next sector processed by analog to digital converter 210b, analog to digital converter 210b exhibits a negative one dB error, generalized circuit 230 will receive an initialization input 234 from a register 240 that is specifically paired with analog to digital converter 210b. This register will presumably hold a value near the negative on dB error, and thus generalized circuit 230 will not have to compensate for a very large differential-regardless of what results were derived from processing the output of analog to digital converter 210a.

Figure 3:
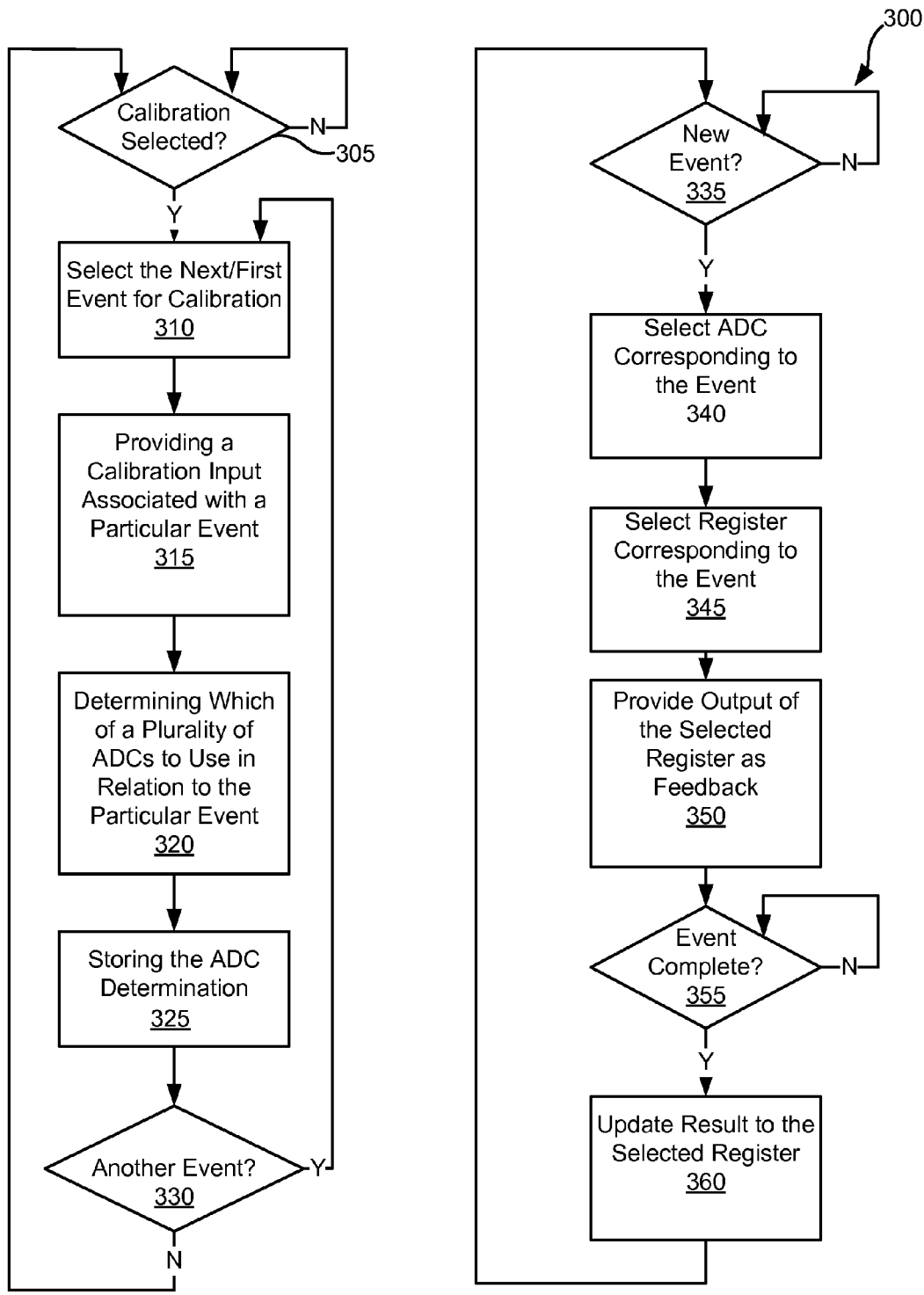
FIG. 3 is a flow diagram showing a method in accordance with various embodiments of the present invention for using multiple potentially mismatched analog to digital converters covering a spectrum of operations.

Turning to FIG. 3, a flow diagram 300 a calibration process is selected (block 305). The process of selecting calibration may be done automatically upon device startup, or at other times depending upon particular system needs. Once calibration is selected (block 305), the first event to be calibrated is selected (block 310). In the case of a read channel device, selecting the first event may include, for example, selecting a first sector of a magnetic storage medium. Based on the disclosure provided herein, one of ordinary skill in the art will recognize a variety of systems and associated events that may be calibrated in accordance with different embodiments of the present invention. A calibration input associated with the selected event is provided as the input (block 315). As is known in the art, a process of selecting between a number of analog to digital converter to use in relation to the calibration input is performed to find an analog to digital converter that is best suited to the particular event (block 320). The determined analog to digital converter is selected and the selection is stored in a register (block 325). Along with the selected analog to digital converter, a register is selected to receive the results from a generalized circuit when the particular event is selected. The selected register is paired with the analog to digital converter, and the pairing it stored in the register. Once the calibration for the particular event is completed, it is determined whether another event remains to be calibrated (block 330). Where another event remains to be calibrated (block 330), the next event is selected (block 310) and the processes of block 315-325 are repeated for the next event. Otherwise, where no more events remain to be calibrated (block 330), the calibration process ends and remains paused until another calibration is selected (block 305).

The pairings stored in memory during the previously described calibration process are used during normal operation of the device. In particular, it is determined whether a new event is identified (block 335). As discussed above, an event may be anything that demands the use of a different analog to digital converter and/or output register. Thus, for example, in the cases of a read channel device, the new event may be the advent of data from a different sector of a magnetic storage medium. A new event may be identified, for example, by the assertion of an event status flag. Where a new event is identified (block 335), the analog to digital converter corresponding to the event is selected (block 340) and the register associated with the event is selected (block 345). This process includes querying the stored analog to digital converter and register pairs to determine the pair corresponding to the particular event, and selecting the output from the register and the output of the selected analog to digital converter as inputs to the generalized circuit (block 350). It is determined whether the ongoing event has completed (355). Where it has not yet completed (block 355), processing using the selected pairs continues. Otherwise, where the event has completed (block 355), the result from the generalized circuit is written to the selected register in preparation for the next time the event is selected (block 360). The processes of blocks 335-360 are repeated for different events using pairs of analog to digital converters and registers corresponding to the particular events.

Thus, the starting value for a generalized circuit (e.g., digital loop) in a sector is not the value adapted from a preceding event (e.g., sector of a magnetic storage medium). Instead, embodiments of the present invention use the adapted value from a previous event that used the same analog to digital converter. Thus, in some cases, it may be that a given register is only used in relation to one particular sector, or may be used in relation to two or more sectors having similar qualities and each being associated with the same analog to digital converter. The generalized circuit is the same for each of the different events, and thus there is not a substantial need for circuit duplication.

Different embodiments of the present invention provide one or more of the following advantages. First, an analog mismatch problem is solved in an efficient way in the digital domain. The approach mitigates the effect of mismatches between analog to digital converters, and yet is a relatively low cost approach. The approach adds a few registers (i.e., one for each analog to digital converter in the system) to hold the starting values of the generalized circuit (e.g., digital loops) corresponding to each ADC. It should be noted that different embodiments of the present invention may be used in relation to any adaptive loop which has memory maintaining a starting value for the adaptive loop.

Figure 4:
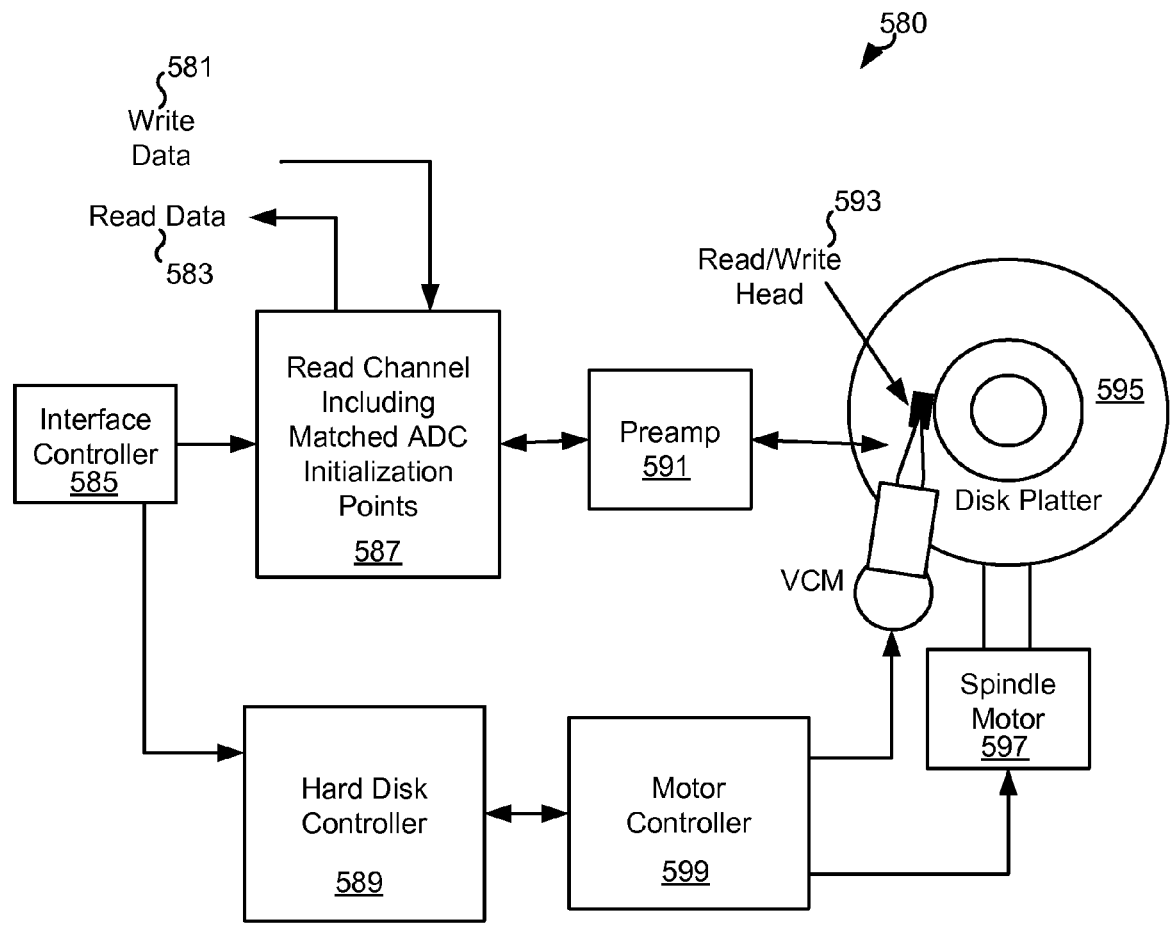
FIG. 4 depicts a hard disk drive system utilizing a read channel with matched analog to digital converters and initialization points in accordance with one or more embodiments of the present invention.

Turning to FIG. 4, a storage system 580 including a media defect and data regeneration system 587 is shown in accordance with various embodiments of the present invention. Storage system 580 may be, for example, a hard disk drive. Storage system 580 includes a read channel 587 with an incorporated matched analog to digital converter and register pair system in accordance with different embodiments of the present invention. The read channel device may include, for example, a system similar to that discussed above in relation to FIG. 2. In such a case, the input to the system may be derived from a preamp 591. In addition, storage system 580 includes an interface controller 585, a hard disk controller 589, a motor controller 599, a spindle motor 597, a disk platter 595, and a read/write head 593. Interface controller 585 controls addressing and timing of data to/from disk platter 595. The data on disk platter 595 consists of groups of magnetic signals that may be detected by read/write head assembly 593 when the assembly is properly positioned over disk platter 595. In a typical read operation, read/write head assembly 593 is accurately positioned by motor controller 599 over a desired data track on disk platter 595. Motor controller 599 both positions read/write head assembly 593 in relation to disk platter 595 and drives spindle motor 597 by moving read/write head assembly to the proper data track on disk platter 595 under the direction of hard disk controller 589. Spindle motor 597 spins disk platter 595 at a determined spin rate (RPMs).

Once read/write head assembly 593 is positioned adjacent the proper data track, magnetic signals representing data on disk platter 595 are sensed by read/write head assembly 593 as disk platter 595 is rotated by spindle motor 597. The sensed magnetic signals are provided as a continuous, minute analog signal representative of the magnetic data on disk platter 595. This minute analog signal is transferred from read/write head assembly 593 to read channel module 587 via preamp 591. Preamp 591 is operable to amplify the minute analog signals accessed from disk platter 595. In addition, preamp 591 is operable to amplify data from read channel module 587 that is destined to be written to disk platter 595. In turn, read channel module 587 decodes (including media defect detection) and digitizes the received analog signal to recreate the information originally written to disk platter 595. This data is provided as read data 583 to a receiving circuit. A write operation is substantially the opposite of the preceding read operation with write data 581 being provided to read channel module 587. This data is then encoded and written to disk platter 595.

In conclusion, the invention provides novel systems, devices, methods and arrangements for compensating for analog to digital converter mismatch. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. An adaptive loop capable of adapting to at least two distinct signal sets, the adaptive loop comprising:
    a generalized circuit including a signal input, a feedback input, and an output;
    a first analog to digital converter paired with a first register;
    a second analog to digital converter paired with a second register;
    an input provided to both the first analog to digital converter and the second analog to digital converter;
    a signal input selector, wherein the signal input selector selects the first analog to digital converter to drive the signal input based on a first event, and selects the second analog to digital converter to drive the signal input based on a second event; and
    a feedback selector, wherein the feedback selector selects an output of the first register as the feedback input to the generalized circuit when the first analog to digital converter is selected, and wherein the feedback selector selects an output of the second register as the feedback input to the generalized circuit when the second analog to digital converter is selected.

2. The adaptive loop of claim 1, wherein the feedback input is an initialization input, and wherein the initialization input is a starting value derived from a previous processing result of an analog to digital converter paired with a register from which the initialization input is derived.

3. The adaptive loop of claim 1, wherein the signal input selector is further operable to determine a first conclusion point associated with the first event and a second conclusion point associated with the second event.

4. The adaptive loop of claim 3, wherein the signal input selector is further operable to cause the first register to store the output whenever the first conclusion point is indicated, and wherein the signal input selector is further operable to cause the second register to store the output whenever the second conclusion point is indicated.

5. The adaptive loop of claim 1, wherein the generalized circuit is a gain loop.

6. The adaptive loop of claim 5, wherein the adaptive loop is implemented as part of a read channel device, wherein the first event indicates a first sector of a storage medium, and wherein the second event indicates a second sector of the storage medium.

7. The adaptive loop of claim 5, wherein the adaptive loop is implemented as part of a read channel device, wherein the first event indicates a first region of a sector of a storage medium, and wherein the second event indicates a second region of the sector of the storage medium.

8. The adaptive loop of claim 1, wherein the adaptive loop further includes a calibration control circuit, and wherein the calibration control circuit is operable to associate the first analog to digital converter with the first event, and to associate the second analog to digital converter with the second event.

9. The adaptive loop of claim 8, wherein the calibration control circuit is implemented using a circuit selected from a group consisting of: a general purpose processor executing computer executable instructions, and a dedicated hardware circuit.

10. The adaptive loop of claim 1, wherein the generalized circuit further includes an initialization input, wherein the adaptive loop includes a first multiplexer operable to provide an output of the first analog to digital converter or an output of the second analog to digital converter to drive the signal input; and wherein the adaptive loop includes a second multiplexer operable to provide an output of the first register or an output of the second register to drive the initialization input.

11. A method for adaptively processing a variety of input signals, the method comprising:
providing an adaptive loop circuit, wherein the adaptive loop circuit includes a data input and an initialization input;
providing a first circuit pair, wherein the first circuit pair includes a first analog to digital converter and first register;
providing a second circuit pair, wherein the second circuit pair includes a second analog to digital converter and a second register;
receiving an input signal;
receiving an event status, wherein the event status initially indicates that the input signal includes data associated with a first event and subsequently indicates that the input signal includes data associated with a second event;
selecting the first circuit pair, wherein an output of the first analog to digital converter is provided as the data input to drive the adaptive loop circuit when the first event is indicated, and wherein an output of the first register is provided as the initialization input; and
selecting the second circuit pair, wherein an output of the second analog to digital converter is provided as the data input to drive the adaptive loop circuit when the second event is indicated, and wherein an output of the second register is provided as the initialization input.

12. The method of claim 11, wherein the method further includes:
receiving an indication of a conclusion of the first event; and
writing the output to the first register.

13. The method of claim 11, wherein the method further includes:
receiving an indication of a conclusion of the second event; and
writing the output to the second register.

14. The method of claim 11, wherein the adaptive loop circuit is a gain loop.

15. The method of claim 11, wherein the adaptive loop circuit is implemented as part of a read channel device, wherein the first event indicates a first sector of a storage medium, and wherein the second event indicates a second sector of the storage medium.

16. The method of claim 11, wherein the adaptive loop circuit is implemented as part of a read channel device, wherein the first event indicates a first region of a sector of a storage medium, and wherein the second event indicates a second region of the sector of the storage medium.

17. The method of claim 11, wherein the method further includes:
performing a calibration process, wherein the calibration process includes:
associating the first analog to digital converter with the first event; and
associating the second analog to digital converter with the second event.

18. A storage system, wherein the storage system comprises:
a storage medium; and
a read channel circuit; wherein the read channel circuit includes an adaptive control circuit having a signal input, an initialization input and an output; and wherein the adaptive control circuit includes:
a first circuit pair, wherein the first circuit pair includes a first analog to digital convener and first register;
a second circuit pair, wherein the second circuit pair includes a second analog to digital converter and a second register;
a signal input selector, wherein the signal input selector selects the first analog to digital converter to drive the signal input and the first register to drive the initialization input based on a first event, and selects the second analog to digital converter to drive the signal input and the second register to drive the initialization input based on a second event; and
an input signal derived from the storage medium and provided as an input to both the first analog to digital convener and the second analog to digital converter.

19. The storage system of claim 18, wherein the signal input selector is further operable to determine a first conclusion point associated with the first event and a second conclusion point associated with the second event; and wherein the signal input selector is further operable to cause the first register to store the output whenever the first conclusion point is indicated, and wherein the signal input selector is further operable to cause the second register to store the output whenever the second conclusion point is indicated.

* * * * *